United States Patent [19]

Adan

[11] Patent Number: 5,401,994
[45] Date of Patent: Mar. 28, 1995

[54] SEMICONDUCTOR DEVICE WITH A NON-UNIFORMLY DOPED CHANNEL

[75] Inventor: Alberto O. Adan, Tenri, Japan

[73] Assignee: Sharp Kabushiki Kaisha, Osaka, Japan

[21] Appl. No.: 70,620

[22] Filed: Jun. 2, 1993

Related U.S. Application Data

[63] Continuation-in-part of Ser. No. 958,451, Oct. 7, 1992, Pat. No. 5,244,823, which is a continuation of Ser. No. 745,341, Aug. 15, 1991, abandoned.

[30] Foreign Application Priority Data

May 21, 1991 [JP]    Japan ................... 3-116155

[51] Int. Cl.$^6$ ............ H01L 29/08; H01L 29/10; H01L 29/88; H01L 21/265
[52] U.S. Cl. .................... 257/335; 257/657; 257/412; 257/404
[58] Field of Search ............. 257/221, 333, 335, 336, 257/344, 395, 408, 413, 755, 900

[56] References Cited

U.S. PATENT DOCUMENTS

| | | | |
|---|---|---|---|
| 4,597,824 | 7/1976 | Shinada et al. | 156/643 |
| 4,599,118 | 7/1986 | Han et al. | 257/336 |
| 4,808,544 | 2/1989 | Matsui | 437/44 |
| 5,015,598 | 5/1991 | Verhaar | 257/408 |
| 5,210,435 | 5/1993 | Roth et al. | 257/344 |

FOREIGN PATENT DOCUMENTS

| | | | |
|---|---|---|---|
| 0083447 | 7/1983 | European Pat. Off. | |
| 2256088 | 11/1992 | United Kingdom | 257/408 |

OTHER PUBLICATIONS

"Gate-Induced Drain Leakage in LDD and Fully-Overlapped LDD MOSFETs", Moon et al., Symposium on VLSI Technology, (1991), p. 49.

International Electron Devices Meeting 1985 Washington D.C. Dec. 1–4, 1985, pp. 230–233; Christopher F. Codella et al: "Halo Doping Effects in Submicron DI-ODD Device Design".

IEEE Electron Device Letters, vol. 11, No. 6, Jun. 1990, New York pp. 253–255; James R. Pfiester et al: "A Selectively Deposited Poly-Gate ITLDD Process with Self-Aligned LDD/Channel Implementation".

IBM Technical Disclosure Bulletin, vol. 22, No. 6, Nov. 1979, New York R. C. Varshney "Double Polysilicon Depletion-Mode MOS Transistor Structure".

IEDM Tech. Dig. (1990), 391, Y. Okumura et al, "A Novel Source-to-Drain Nonuniformly Doped Channel (NUDC) MOSFET for High Current Drivability and Threshold Voltage Controllability".

Primary Examiner—Robert P. Limanek
Assistant Examiner—David B. Hardy
Attorney, Agent, or Firm—Nixon & Vanderhye

[57] ABSTRACT

A semiconductor device with a non-uniformly and lightly doped channel comprises a gate electrode formed on a silicon substrate of first conductivity through the intermediary of a gate oxide dielectric film, and an extension of each side walls of the gate electrode composed of a thin polysilicon layer which is substantially thinner than the gate electrode, the silicon substrate having a channel region in which its central part is doped with ions of first conductivity at a concentration higher than in the silicon substrate and its part below the thin polysilicon layer is doped with ions of first conductivity at a concentration higher than in the central part, and having at an outer region of the channel region a source-drain region doped with ions of second conductivity.

5 Claims, 5 Drawing Sheets

SEMICONDUCTOR DEVICE WITH A NON-UNIFORMLY DOPED CHANNEL

This is a continuation-in-part of application Ser. No. 07/958,451, filed Oct. 7, 1992, U.S. Pat. No. 5,244,823, which was in turn a continuation of Ser. No. 07/745,341, filed Aug. 15, 1991, now abandoned.

BACKGROUND OF THE INVENTION

1. Field of the Invention

The present invention relates to a semiconductor device and, more particularly to a Metal Oxide Semiconductor Field Effect Transistor (called hereunder, MOSFET) having a non-uniformly doped submicron channel length and L-shaped side wall extensions.

2. Description of the Prior Art

Recently, MOS transistors have been rapidly scaled down, involving shortened channel lengths thereof. This results in severe degradation of electrical characteristics of MOS transistors due to threshold voltage lowering and mobility degradation when the channel length becomes comparable to the source and drain regions depletion layer width. These effects are known as "short-channel degradation", and are a serious limitation for further device scaling.

Some approaches for overcoming the above effects are known. One of these approaches adopts the so-called "halo" or "pocket" deep implantation to provide highly doped regions 23 and 24 near the respective junctions of source 21 and drain 22 of a MOS transistor 20, as shown in FIG. 6 (C. F. Codella and S Ogura, "Halo doping effects in submicron DI-LDD device design", IEDM Tech. Dig. (1985), 230). However, the depth and lateral spread of this implantation may be limited in sub-half micrometer channel length transistors, and in addition, a higher doping concentration at the drain junction increases the junction parasitic capacitance, degrading device speed.

Another approach uses oblique rotating ion implantation to form a non-uniformly doped channel of a MOS transistor 30, as shown in FIG. 7 (Y. Okumura, et al.: "A Novel Source-to-Drain Nonuniformly doped Channel (NUDC) MOSFET for high current drivability and threshold voltage controllability", IEDM Tech. Dig. (1990), 391). According to this technique, the doping concentration is higher near the source and drain, which reduces the widening of the depletion region, and at the same time, the doping concentration in the middle of the channel is reduced to improve the carrier mobility. The limitation of his technique is that in order to penetrate about ⅓ of the channel length, a relatively large implantation angle (Q) and a relatively high energy are required. This results in: (i) higher concentration at the drain junction, degrading device speed; and (ii) difficult control of the channel middle region width, especially in sub-half micrometer devices.

Still another approach employs the GOLD (Gate Over-lapped LDD) or the Inverse T gate structures in submicron channel MOSFET, which is very convenient to reduce Hot-Carrier induced degradation.

As is seen from FIG. 8, in the GOLD structure, a gate oxide layer 42, a polysilicon layer 43, a silicon oxide layer 44 and a polysilicon layer 45a are laminated in sequence on a silicon substrate 41. Subsequently, the polysilicon layer 45a is etched to form a gate electrode 45. Using the gate electrode 45 as a mask, ions are implanted to form N− regions. Then, a polysilicon 46a is disposed thereon and a side wall 46 is obtained by etching. Next, using the side wall 46 as a mask, ions are implanted to form N+ regions (Symposium on VLSI Technology, p49 (1991). Apparently, the LDD regions must be completely under the gate electrode 45 in order to improve the transistor strength against Hot-carriers. However, this structure requires the lamination of three polysilicon layers, resulting in a complex fabrication process.

SUMMARY OF THE INVENTION

The present invention is accomplished to overcome the foregoing problems of the prior art.

Thus, the present invention provides a semiconductor device with a non-uniformaly doped channel comprising a gate electrode formed on a silicon substrate of first conductivity through the intermediary of a gate oxide dielectric film; and an extension of each side wall of the gate electrode composed of a thin polysilicon layer which is substantially thinner than the gate electrode;

the silicon substrate having a channel region in which its central part is doped with ions of first conductivity at a concentration higher than in the silicon substrate and portions below the thin polysilicon layer doped with ions of first conductivity at a concentration higher than in the central part, and having at an outer region of the channel region source-drain region doped with ions of second conductivity.

DETAILED DESCRIPTION OF THE PREFERRED EMBODIMENTS

A preferred embodiment of the present invention will now be described in detail with reference to FIGS. 1(A)–(E).

Figure 1A:
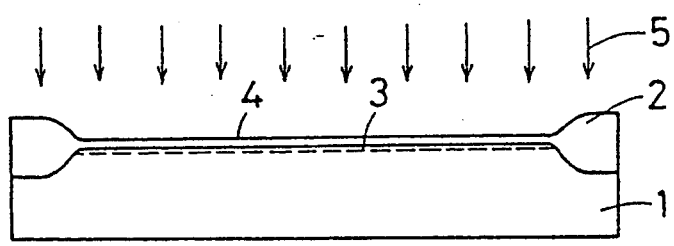
FIGS. 1(A)–(E) are sectional views illustrating a process for producing a MOSFET according to the invention.

(a) Referring to FIG. 1(A), a field oxide film 2 is first formed on a Si substrate 1 to provide an isolation region 2 and an active region 3. The field oxide film 2 is formed to about 5000–6000 Å thick using the well-known LOCOS technique at a temperature, for example, 1050° C. in the presence of $H_2$ and $O_2$. Subsequently, a thin $SiO_2$ layer 4 is formed to about 200–300 Å thick over the active region 3 by thermal oxidation of silicon at, for example, 1050° C. in $O_2$ atmosphere, or a CVD process using, for example, $SiH_4$ and $O_2$, at 800°–850° C. and 0.5–2.0 Torr.

(b) A first channel doping is performed by implanting P-type ions 5 such as B (boron) ions or In (indium) ions into the Si substrate 1 using the thin $SiO_2$ layer 4 as a screening layer. The implantation is effected orthogonally to the substrate 1 but shallowly, thereby defining the doping depth and the impurity atoms concentration at the center of the channel ($P_1$ in FIG. 1(E)). Conditions for the implantation are selected depending on the characteristics of an intended device. Usually the acceleration energy is set to about 30-40 KeV; the dosage is set to about $1-5 \times 10^{12}$ cm$^{-2}$.

Figure 1B:
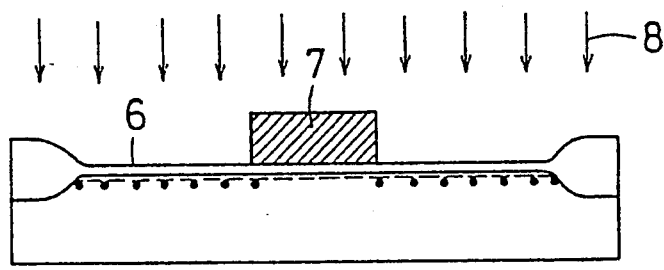

(c) The thin $SiO_2$ layer 4 is removed by, for example, wet etching (1% HF aqueous solution), and then as shown in FIG. 1(B), a gate oxide dielectric film 6 is grown to a predetermined thickness by thermal oxidation. For example, in a 0.5 μm channel process, the gate oxide dielectric film 6 is grown to about 100–130 Å thick by heating at about 900°–1000° C. for 0.5–1 hour.

Next, as shown in FIG. 1(B) a gate electrode 7 is formed in the following typical manner. A polysilicon layer is first deposited to about 1000–4000 Å thick by LPCVD process using, for example, $SiH_4$, at 600°–650° C. and 0.5 Torr; subsequently the polysilicon layer is doped with N-type ions such as phosphorus ions (acceleration energy: 60–80 KeV; dosage: $1 \times 10^{15}$ cm$^{-2}$) so as to lower the resistance of the layer, and; the thus obtained polysilicon layer is patterned and etched by RIE technique ($Cl_2+O_2+HBr$, 20 mTorr) to form the gate electrode 7.

(d) Subsequently a second channel doping is performed by implanting P-type ions 8 such as B ions or In ions (acceleration energy: 30–40 KeV, dosage: $1 \times 10^{12}-10^{13}$ cm$^{-2}$), using the gate electrode 7 as a mask. The second channel doping together with the first channel doping defines the doping depth and the impurity atoms concentration at the extremes of the channel ($P_2$ and $P_3$ of FIG. 1(E)). The doping depth and the impurity atoms concentration can be optimized to reduce short-channel degradation.

Figure 1C:
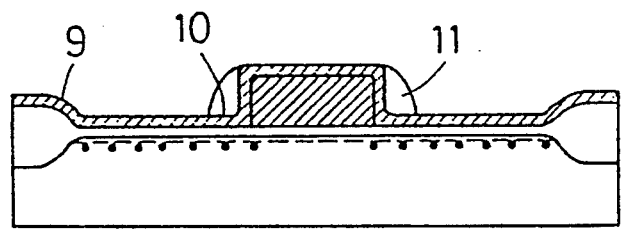

(e) Referring to FIG. 1(C), a thin polysilicon layer 9 is depositing to about 200–500 Å thick by, for example, LPCVD process using $SiH_4$ or the like, at 600°–650° C. and about 0.5 Torr.

(f) On the thin polysilicon 9, a $SiO_2$ layer is deposited to about 1000–2000 Å thick by, for example, CVD process using $SiH_4+O_2$, at 800°–900° C.

Figure 1D:
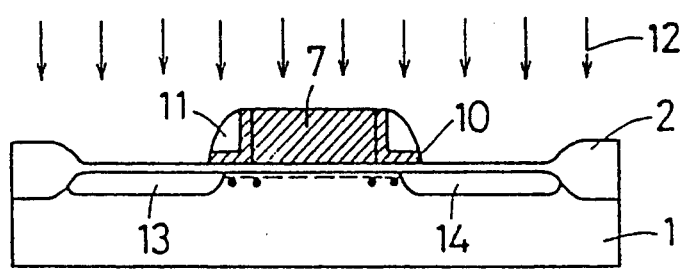

(g) Referring to FIG. 1(D), the above $SiO_2$ layer and the polysilicon layer 9 are etched, while retaining a portion of them so as to form side walls on opposite sides of the gate electrode 7, the side wall extensions 10 (the retained portion of the polysilicon layer 9) and the retained $SiO_2$ layer 11. The etching in this process may be performed as follows. First, the $SiO_2$ layer is etched by RIE technique ($CHF_3+CF_4+Ar$, 1 Torr) to form the retained $SiO_2$ layer 11 near the gate electrode 7. Subsequently the polysilicon layer 9 is etched by RIE technique ($Cl_2+O_2+HBr$, 20 mTorr) to form the side wall extensions 10.

(h) As shown in FIG. 1(D), implantation of N-type ions 12 is performed using the side wall extensions 10 and the gate electrode 7 as a mask to form a source region 13 and a drain region 14, followed by thermal treatment. In the implantation P ions or As ions, for example, are used as the N-type ions 12, with acceleration energy: 30–50 KeV, dosage: $1-3 \times 10^{15}$ cm$^{-2}$. The thermal treatment is performed at about 800°–850° C. for 0.5–1 hour.

Figure 1E:
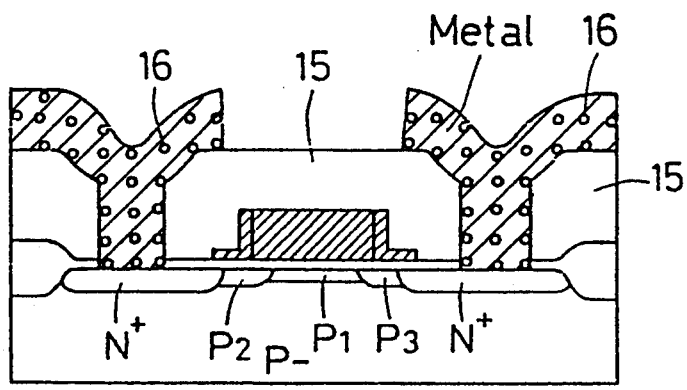

(i) Referring to FIG. 1(E), another $SiO_2$ layer 15 as an isolation layer is deposited by, for example, CVD process, followed by thermal treatment (850°–950° C. for 0.5–1 hour). Then, contact holes are formed and filled with a metal layer 16 to form devices interconnection according to well-known techniques.

According to the process of the invention, a MOS transistor structure shown in FIG. 1(E) is obtained. By the first and second channel dopings the central portion ($P_1$ of FIG. 1(E)) is lightly doped so as to enhance the mobility, while the extreme portions ($P_2$ and $P_3$ of FIG. 1(E)) of the channel are heavily doped, thereby reducing the depletion areas of the source 13 and the drain 14. Such non-uniform doping is shallowly performed so that the parasitic drain junction capacitance will not increase unnecessarily, whereby the device speed is not lowered. Thus, the process of the present invention makes it possible to fabricate MOS transistors with a higher yield and low cost in a simpler manner than the prior art methods.

As a variation of the technique of the present invention, the LDD MOSFET with shallow non-uniformly doped channel can be obtained by using a disposable side-wall spacer.

Furthermore, the optimization of the device of the present invention can be achieved by varying a thickness of the oxide film of the disposable side-wall spacer of the above LDD MOSFET.

EXAMPLE

Example 1 a MOS transistor was fabricated according to the following process.

(a) A Si substrate was patterned with a resist and heated at 1000° C. for 2 hours under oxygen atmosphere to form an isolation region, which was constituted by a field oxide film of about 6000 Å thick, and an active region. On the active region a thin $SiO_2$ layer was deposited to about 250 Å thick by CVD process using $SiH_4+O_2$ at 850° C.

(b) A first channel doping was performed by implanting B ions into the active region orthogonally to the substrate with acceleration energy: 30 KeV, dosage: $1 \times 10^{12}$ cm$^{-2}$, using the thin $SiO_2$ layer as a screening layer.

(c) The thin $SiO_2$ layer was removed using 1% HF aqueous solution. Thereafter, a gate oxide dielectric film was grown to 120 Å thick on the substrate by thermal oxidation (heating at 900° C. for 18 min under oxygen atmosphere).

Next, a polysilicon layer was deposited to 2500 Å thick over the gate oxide dielectric film by LPCVD process using $SiH_4$ at 600°–650° C., 0.5 Torr. The polysilicon layer was implanted with phosphorus ions (acceleration energy: 70 KeV, dosage: $1 \times 10^{15}$ cm$^{-2}$) to be become N type. The polysilicon layer thus obtained was patterned and etched by RIE technique ($Cl_2+O_2+HBr$, 20 mTorr) to form a gate electrode.

(d) A second channel doping was performed by implanting B ions orthogonally to the substrate (acceleration energy: 30 KeV, dosage: $1 \times 10^{13}$ cm$^{-2}$), using the gate electrode as a mask.

(e) A thin polysilicon layer was deposited to 350 Å thick by LPCVD process using $SiH_4$ at 620° C., 0.5 Torr, to form a thin polysilicon layer.

(f) A SiO$_2$ layer was deposited to 1500 Å thick to cover the thin polysilicon layer by CVD process using SiH$_4$+O$_2$ at 850° C.

(g) The SiO$_2$ layer was etched but retained near the gate electrode by RIE technique (CHF$_3$+CF$_4$+Ar, 1 Torr) to form the retained portion of the SiO$_2$ layer 11, then the thin polysilicon layer was also etched but retained near the gate electrode by RIE technique (Cl$_2$+O$_2$+HBr, 20 mTorr) to form L-shaped gate extension 10. Consequently side walls composed of the portions 10 and 11 were formed.

(h) Arsenic ions were implanted (acceleration energy: 40 KeV, dosage: $3 \times 10^{15}$ cm$^{-1}$) to form the source and drain using the electrode and the gate extensions as a mask, followed by heat treatment at 800° C. for 1 hour.

(i) Another SiO$_2$ layer was deposited to 6000 Å thick by well-known process, followed by heat treatment at 900° C. for 0.5 hours. Contact holes were formed, then filled with metal to form devices interconnection.

Thus, a MOS transistor having a half-micrometer channel length was obtained, which exhibited satisfactory electrical characteristics.

Example 2

The manufacturing process of the LDD MOSFET is now described below with reference to FIGS. 2(A)-(E).

Source 13 and drain 14 regions were formed by the same method of the above example 1, using the gate electrode 7, the side wall extension 10 and the retained SiO$_2$ layer 11 as a mask (FIG. 2(A) to (D)). After the retained SiO$_2$ layer 11 was removed, for example, by anisotropic etching, N-type ions (As+ or P+) were implanted with about 30 to 40 keV energy for P+ and a dose of about $1 \times 10^{14}$ ions/cm$^2$, thereby forming the lightly doped source 19 and drain 20.

The lightly doped source/drain junctions are completely under the polysilicon side wall gate extensions, this results in the fully overlapped structure like GOLD.

Example 3

Figure 2A:
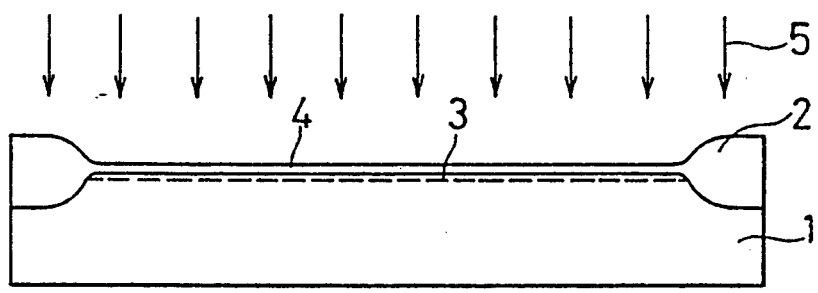
FIGS. 2(A)–(E) are sectional views illustrating a process for producing an another MOSFET according to the invention.
Figure 2B:
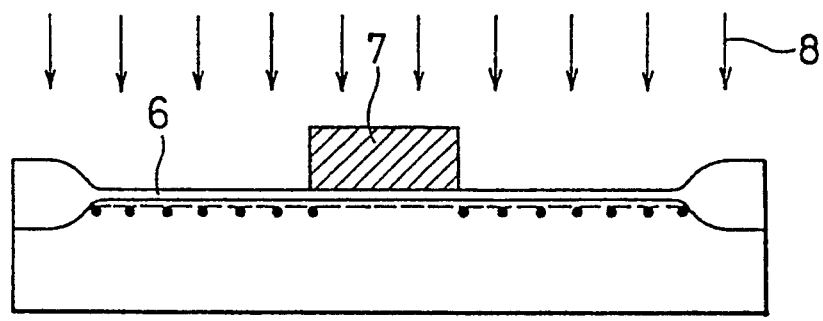
Figure 2C:
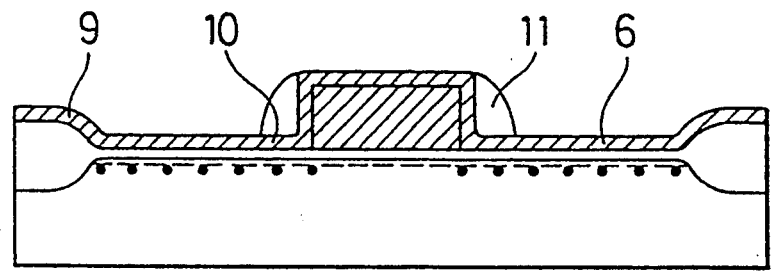
Figure 2D:
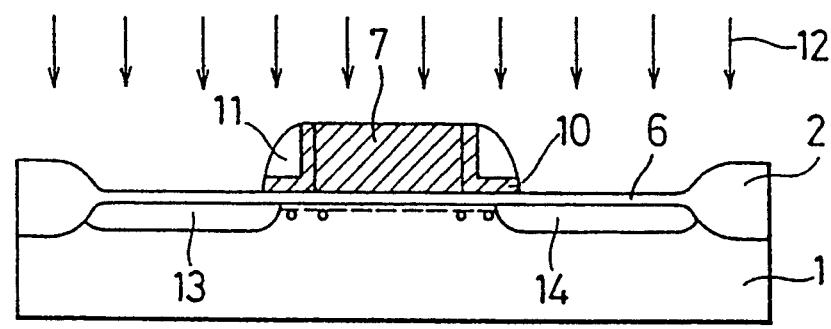
Figure 2E:
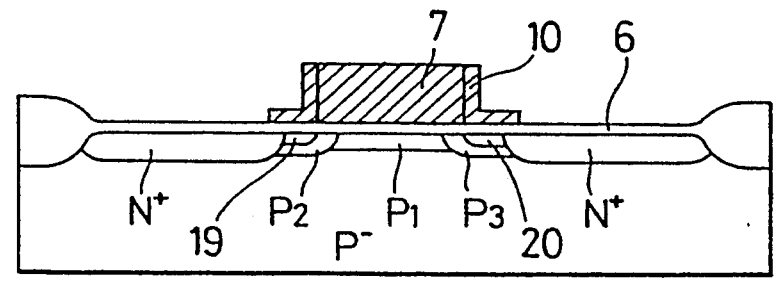
Figure 3:
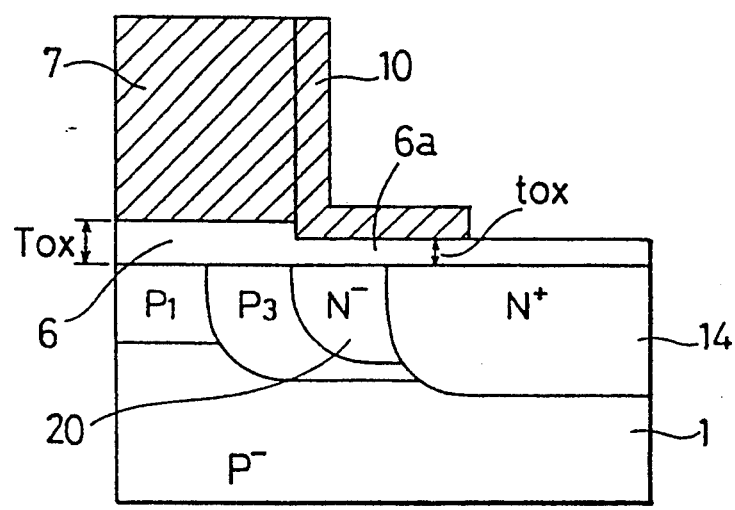
FIG. 3 is a sectional view of main portion illustrating still another MOSFET of the invention.

In the MOSFET having the lightly doped source/drain junction shown in FIG. 2(E), the capacitive coupling between gate and drain can be varied by changing a thickness of the layer of oxide layer 6a located just beneath the side wall extension 10 as shown in FIG. 3. Namely, by changing a thickness of the layer, the resistance caused by the lightly doped drain 20 can be reduced and deterioration of driving ability can be prevented.

Figure 4:
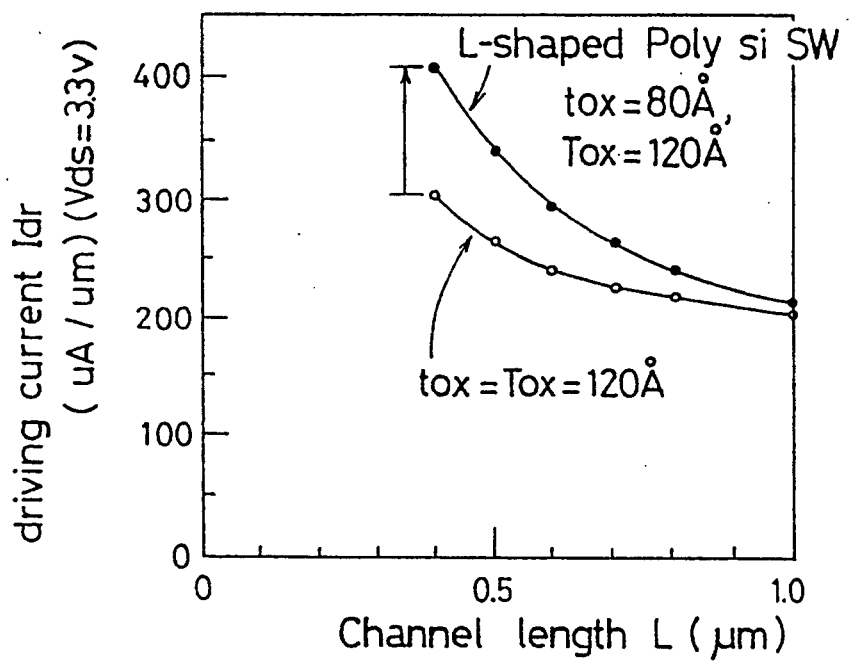
FIG. 4 is a diagram showing relationship between channel length and driving current.

For example, as is shown in FIG. 4, when $t_{ox}$ is 80 Å and $T_{ox}$ is 120 Å, a driving current increases in accordance with shortening the channel length.

Example 4

Figure 5:
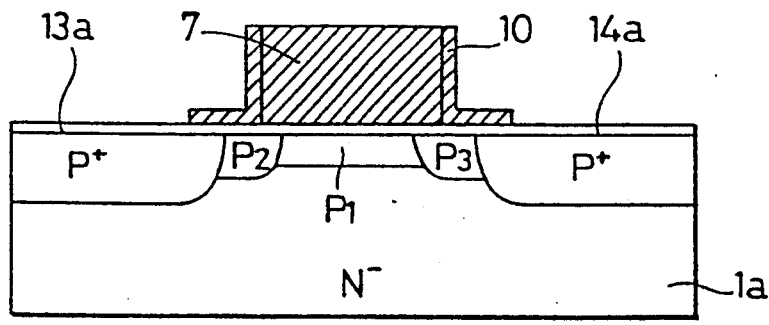
FIG. 5 is a sectional view illustrating another MOSFET of the invention.
Figure 6:
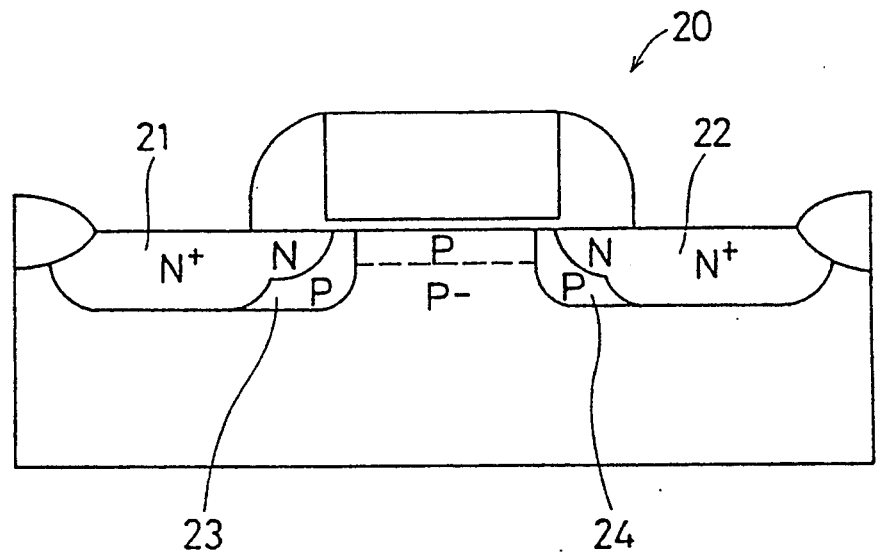
FIG. 6 is a view illustrating a structure of a prior art MOS transistor.
Figure 7:
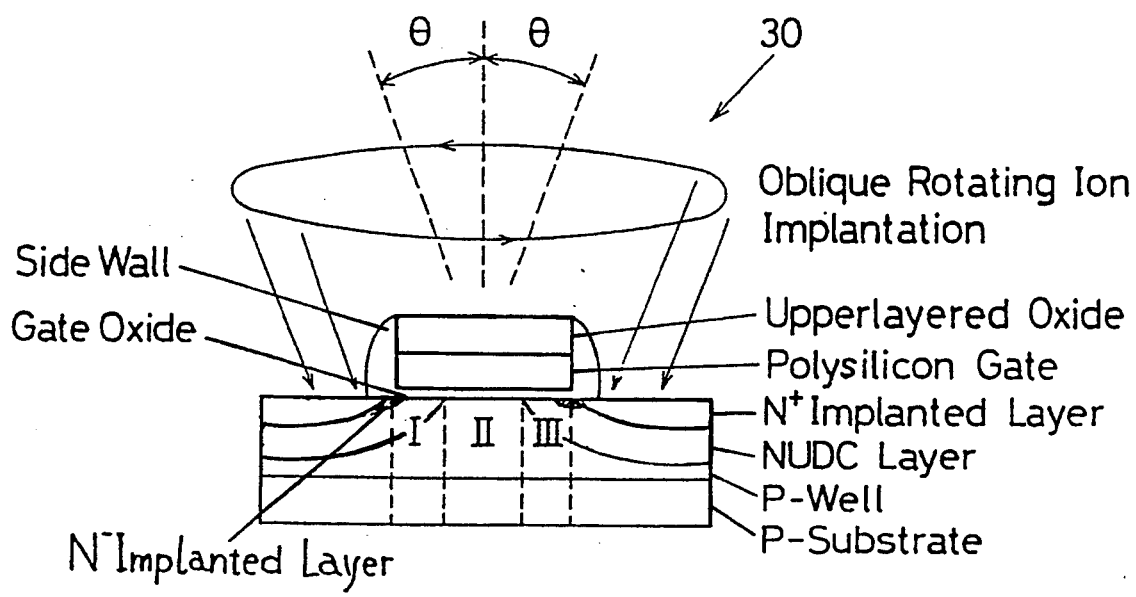
FIG. 7 is a view illustrating structure of another prior art MOS transistor.
Figure 8A:
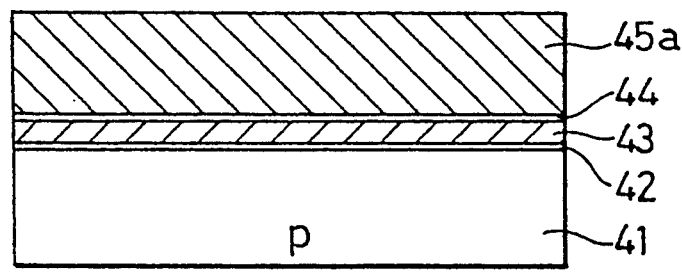
FIGS. 8(A)–(D) are sectional views illustrating a process for producing conventional MOSFET.
Figure 8B:
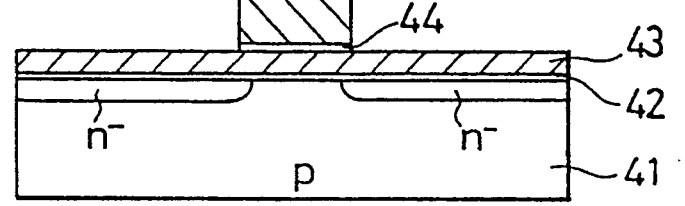
Figure 8C:
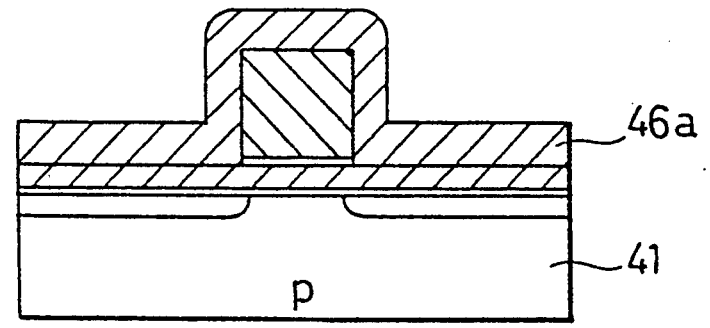
Figure 8D:
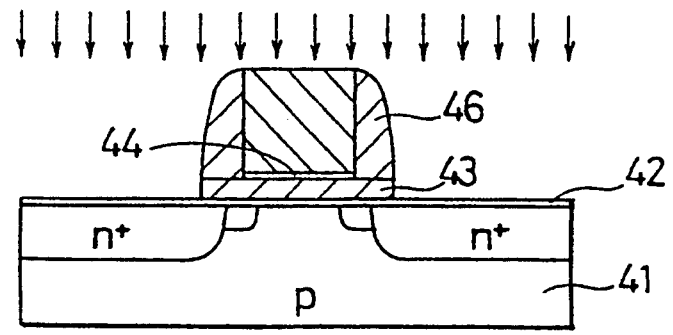

With reference to FIG. 5, Buried-channel PMOSFET is described as below.

In the present example, the gate electrode 7 and the side wall extension 10 are formed on N-type silicon substrate 1a which is provided with P-type source 13a and drain 14a thereon. To a channel region P1 located just beneath the gate electrode 7, conductive ions different from that implanted to the silicon substrate 1a are implanted, and to the regions P2 and P3 located just beneath the side wall extension 10, the same conductive ions as implanted to the silicon substrate 1a are further implanted.

According to the process of the invention, a non-uniformly and lightly doped channel was formed. This results in reduced degradation of transistor characteristics by short-channel effects, increased effective mobility and drive current, and no increase of the parasitic drain junction capacitance. Thus, a MOS transistor having a sub-half micrometer channel length can be fabricated in a simplified manner with a high yield.

While only certain preferred embodiments have been described in detail, as will be apparent with those familiar with the art, certain changes and modifications can be made without departing from the scope of the invention as defied by the following claims.

What we claimed is

1. A semiconductor device with a non-uniformly and lightly doped channel comprising
   a gate electrode having side walls formed on a gate oxide dielectric film, said gate oxide dielectric film being formed on a silicon substrate of a first conductivity type film;
   an extension extending from and in contact with each side wall of the gate electrode, the extensions being composed of a thin polysilicon layer on the gate oxide dielectric film, said thin polysilicon layer being substantially thinner than the gate electrode;
   the silicon substrate including a channel region, said channel region having a central portion which is doped with ions of a first conductivity type at a concentration higher than in the silicon substrate and edge portions located below each thin polysilicon layer extension doped with ions of the first conductivity type at a concentration higher than in the central portion, and having at an outer region of the channel region source-drain regions doped with ions of a second conductivity type.

2. A semiconductor device of claim 1 wherein each thin polysilicon layer extension is L-shaped.

3. A semiconductor device of claim 1 wherein the gate electrode and the thin polysilicon layer extensions formed on the side walls of the gate electrode form an inverted T shape when viewed in cross section.

4. A semiconductor device of claim 1 wherein a portion of the gate oxide dielectric film below the extension of the side wall of the gate electrode is thinner than a portion of the gate oxide dielectric film below the gate electrode.

5. A semiconductor device of claim 1 wherein a region doped with ions of a second conductivity type is formed in the surface of the substrate below the thin polysilicon layer extensions and portions of the gate oxide dielectric film below the extensions of the side walls of the gate electrode are thinner than a portion of the gate oxide dielectric film below the gate electrode.

* * * * *